US006875332B2

(12) United States Patent
Ishiyama

(10) Patent No.: US 6,875,332 B2
(45) Date of Patent: Apr. 5, 2005

(54) FUNCTIONAL ALLOY PLATING USING SUBSTITUTE BONDING MATERIAL FOR PB AND ELECTRONIC COMPONENT TO BE MOUNTED TO WHICH THE FUNCTIONAL ALLOY PLATING IS APPLIED

(75) Inventor: Masaaki Ishiyama, Tokyo (JP)

(73) Assignee: Nishihara Rikoh Corporation, Tokyo (JP)

( * ) Notice: Subject to any disclaimer, the term of this patent is extended or adjusted under 35 U.S.C. 154(b) by 40 days.

(21) Appl. No.: 10/256,010

(22) Filed: Sep. 27, 2002

(65) Prior Publication Data

US 2003/0141192 A1 Jul. 31, 2003

Related U.S. Application Data

(62) Division of application No. 09/566,125, filed on May 5, 2000, now Pat. No. 6,478,944.

(30) Foreign Application Priority Data

May 7, 1999 (JP) .......................................... 11-164307

(51) Int. Cl.[7] .............................................. C25D 18/00
(52) U.S. Cl. ....................... 205/103; 205/104; 205/123; 205/241; 205/252; 228/208; 228/254
(58) Field of Search ................................ 205/103, 104, 205/123, 239, 241, 252, 102; 228/208, 209, 254

(56) References Cited

U.S. PATENT DOCUMENTS

| 5,643,432 | A | 7/1997 | Qiu |
|---|---|---|---|
| 5,674,374 | A | 10/1997 | Sakurai et al. |
| 5,759,379 | A | 6/1998 | Cavallotti et al. |
| 5,948,235 | A | 9/1999 | Arai |
| 6,203,684 | B1 * | 3/2001 | Taylor et al. ............... 205/103 |
| 6,478,944 | B1 | 11/2002 | Ishiyama |

FOREIGN PATENT DOCUMENTS

| EP | 0474499 | 3/1992 |
|---|---|---|
| JP | 63187654 | 8/1988 |
| JP | 63-49382 | 10/1988 |
| JP | 2543619 | 7/1996 |

OTHER PUBLICATIONS

An English Language abstract of JP 63–187654, no date.
An English Language abstract of JP 63–49382, no date.
IEEE Standard Dictionary of Electrical and Electronics Terms, ANSI/IEEE std 100–1988, Fourth Edition, pp. 1013 and 906, no date.

* cited by examiner

Primary Examiner—Roy King
Assistant Examiner—William T. Leader
(74) Attorney, Agent, or Firm—Greenblum & Bernstein, P.L.C.

(57) ABSTRACT

The present invention relates to a to-be-mounted electronic component to which functional alloy plating using a bonding material for mounting is applied with a substitute bonding material for solder (tin-lead alloy), and aims at providing alloy plating which has been put to a practical use in such a way that the function of existing alloy plating of this type has been significantly improved to eliminate toxic plating from various kinds of electronic components for use in electronic devices so that it is useful in protecting the environment.

20 Claims, 3 Drawing Sheets

FUNCTIONAL ALLOY PLATING USING SUBSTITUTE BONDING MATERIAL FOR PB AND ELECTRONIC COMPONENT TO BE MOUNTED TO WHICH THE FUNCTIONAL ALLOY PLATING IS APPLIED

CROSS-REFERENCE TO RELATED APPLICATIONS

The present application is a divisional application of U.S. application Ser. No. 09/566,125 filed May 5, 2000 now U.S. pat. No. 6,478,944, and which claims priority of Japanese Application No. 11-164307, filed May 7, 1999. The entire disclosure of application Ser. No. 09/566,125 is considered as being part of the disclosure of this application, and the entire disclosure of application Ser. No. 09/566,125 is expressly incorporated by reference herein in its entirety.

DETAILED DESCRIPTION OF THE INVENTION

[Field of Utilization in Industry]

The present invention relates to a to-be-mounted electronic component to which functional alloy plating using a bonding material for mounting is applied with a substitute bonding material for solder (tin-lead alloy), and aims at providing alloy plating which has been put to a practical use in such a way that the function of existing alloy plating of this type has been significantly improved to eliminate toxic plating from various kinds of electronic components for use in electronic devices so that it is useful in protecting the environment.

[Background of the Invention]

As solder which does not use lead (Pb) (Pb-free solder), various new bonding agents have been developed and their properties become apparent. And, the stage is proceeding to the development of their manufacturing methods. Tin (Sn)-bismuth (Bi), Sn-indium alloy (In), Sn-zinc alloy (Zn), Sn plating etc. are considered as Pb-free solder to devices. The cost for the Sn—In alloy among them is extremely high, about 25 times the cost for Sn—Bi. The Sn—Zn alloy has a problem on the solderability after heat resistance because Zn is prone to be oxidized. This leaves Sn—Ag, Sn—Bi and Sn.

Bi on copper may be thermally diffused at the time of reflow and may be peeled, so that Sn—Bi for devices should have nickel applied as a base in order to avoid the peeling.

If a coat offset (melt-originated offset) occurs when a surface-mounting device is melted, the bonding surface has a rough surface, so that the bonding surface becomes smaller, thus lowering the bonding strength. Prevention of a melt-originated offset which makes organic eutectoid in a coat extremely small is attempted by applying plating according to this invention.

[Prior Art]

Conventionally, solder (tin-lead alloy) has been used for a long time as a bonding material for mounting electronic device components. Recently, the harmfulness of lead has been noticed mainly in America and Europe and removal of lead from electronic devices has progressed rapidly.

Meanwhile, in Japan has already started a movement of voluntary removal mainly by the electronics industry.

Electroplating is applied to most of materials for to-be-mounted electronic components as tinning. Therefore, there is a pressing need to industrialize plating of substitute alloys for the industrial growth.

[Problem to be Solved by the Invention]

As solder which is an essential bonding material for the aforementioned electronic components contain lead (Pb), however, when electronic devices are disposed of, lead would be melted and seep into groundwater from a junk yard, raising a problem of environmental pollution, unless electronic components having to-be-mounted parts containing solder's lead are removed.

[Means for Solving the Problem]

Accordingly, it is an object of this invention to overcome the problem of the prior art and to provide electronic components to be on which very practical alloy plating for bonding that is the existing alloy plating of this type which has been improved significantly is applied using a substitute metal for lead in solder alloy plating.

The first of this invention is functional alloy plating using substitute bonding material for Pb and electronic component to be mounted to which the functional alloy plating is applied, characterized in that with Sn as a base, one of Bi, Ag and Cu is selected, a Bi content to the Sn is set to 1.0% or less, the Bi content to the Sn is set to 2.0 to 10.0%, an Ag content to the Sn is set to 1.0 to 3.0%, the Ag content to the Sn is set to 3.0 to 5.0%, the Ag content to the Sn is set to 8.0 to 10.0%, or a Cu content to the Sn is set to 0.5 to 1.0%, and an electrolytic process is performed with a special waveform.

The second of this invention is functional alloy plating using substitute bonding material for Pb and electronic component to be mounted to which the functional alloy plating is applied, characterized in that an IC chip is wire-bonded to a lead frame and outer leads exposed outside a molded IC package are subjected to an electrolytic process with a Bi content to Sn whose content is 99.0% or greater being set to 1.0% or less and with a special waveform.

The third of this invention is functional alloy plating using substitute bonding material for Pb and electronic component to be mounted to which the functional alloy plating is applied, characterized in that an IC chip is wire-bonded to a lead frame and outer leads exposed outside a molded IC package are subjected to an electrolytic process with a Bi content to Sn whose content is 98.0 to 90.0% being set to 2.0 to 10.0% and with a special waveform.

The fourth of this invention is functional alloy plating using substitute bonding material for Pb and electronic component to be mounted to which the functional alloy plating is applied, characterized in that an IC chip is wire-bonded to a lead frame and outer leads exposed outside a molded IC package are subjected to an electrolytic process with an Ag content to Sn whose content is 99.0 to 97.0% being set to 1.0 to 3.0% and with a special waveform.

The fifth of this invention is functional alloy plating using substitute bonding material for Pb and electronic component to be mounted to which the functional alloy plating is applied, characterized in that an IC chip is wire-bonded to a lead frame and outer leads exposed outside a molded IC package are subjected to an electrolytic process with an Ag content to Sn whose content is 97.0 to 95.0% being set to 3.0 to 5.0% and with a special waveform.

The sixth of this invention is functional alloy plating using substitute bonding material for Pb and electronic component to be mounted to which the functional alloy plating is applied, characterized in that an IC chip is wire-bonded to a lead frame and outer leads exposed outside a molded IC package are subjected to an electrolytic process with an Ag content to Sn whose content is 92.0 to 90.0% being set to 8.0 to 10.0% and with a special waveform.

The seventh of this invention is functional alloy plating using substitute bonding material for Pb and electronic component to be mounted to which the functional alloy plating is applied, characterized in that an IC chip is wire-bonded to a lead frame and outer leads exposed outside a molded IC package are subjected to an electrolytic process with a Cu content to Sn whose content is 99.5 to 99.0% being set to 0.5 to 1.0% and with a special waveform.

The eighth of this invention is functional alloy plating using substitute bonding material for Pb and electronic component to be mounted to which the functional alloy plating is applied, characterized in that an electrode pattern of a printed circuit board is subjected to an electrolytic process with a Bi content to Sn whose content is 99.0% or greater being set to 1.0% or less and with a special waveform.

The ninth of this invention is functional alloy plating using substitute bonding material for Pb and electronic component to be mounted to which the functional alloy plating is applied, characterized in that an electrode pattern of a printed circuit board is subjected to an electrolytic process with a Bi content to Sn whose content is 98.0 to 90.0% being set to 2.0 to 10.0% and with a special waveform.

The tenth of this invention is functional alloy plating using substitute bonding material for Pb and electronic component to be mounted to which the functional alloy plating is applied, characterized in that an electrode pattern of a printed circuit board is subjected to an electrolytic process with an Ag content to Sn whose content is 99.0 to 97.0% being set to 1.0 to 3.0% and with a special waveform.

The eleventh of this invention is functional alloy plating using substitute bonding material for Pb and electronic component to be mounted to which the functional alloy plating is applied, characterized in that an electrode pattern of a printed circuit board is subjected to an electrolytic process with an Ag content to a content of 97.0 to 95.0% being set to 3.0 to 5.0% and with a special waveform.

The twelfth of this invention is functional alloy plating using substitute bonding material for Pb and electronic component to be mounted to which the functional alloy plating is applied, characterized in that an electrode pattern of a printed circuit board is subjected to an electrolytic process with an Ag content to a content of 92.0 to 90.0% being set to 8.0 to 10.0% and with a special waveform.

The thirteenth of this invention is functional alloy plating using substitute bonding material for Pb and electronic component to be mounted to which the functional alloy plating is applied, characterized in that an electrode pattern of a printed circuit board is subjected to an electrolytic process with a Cu content to Sn whose content is 99.5 to 99.0% being set to 0.5 to 1.0% and with a special waveform.

The fourteenth of this invention is functional alloy plating using substitute bonding material for Pb and electronic component to be mounted to which the functional alloy plating is applied, characterized in that a chip tantalum capacitor is wire-bonded to a lead frame and outer leads exposed outside the chip tantalum capacitor are subjected to an electrolytic process with a Bi content to Sn whose content is 99.0% or greater being set to 1.0% or less and with a special waveform.

The fifteenth of this invention is functional alloy plating using substitute bonding material for Pb and electronic component to be mounted to which the functional alloy plating is applied, characterized in that a chip tantalum capacitor is wire-bonded to a lead frame and outer leads exposed outside the chip tantalum capacitor are subjected to an electrolytic process with a Bi content to Sn whose content is 98.0 to 90.0% being set to 2.0 to 10.0% and with a special waveform.

The sixteenth of this invention is functional alloy plating using substitute bonding material for Pb and electronic component to be mounted to which the functional alloy plating is applied, characterized in that a chip tantalum capacitor is wire-bonded to a lead frame and outer leads exposed outside the chip tantalum capacitor are subjected to an electrolytic process with an Ag content to Sn whose content is 99.0 to 97.0% being set to 1.0 to 3.0% and with a special waveform.

The seventeenth of this invention is functional alloy plating using substitute bonding material for Pb and electronic component to be mounted to which the functional alloy plating is applied, characterized in that a chip tantalum capacitor is wire-bonded to a lead frame and outer leads exposed outside the chip tantalum capacitor are subjected to an electrolytic process with an Ag content to Sn whose content is 97.0 to 95.0% being set to 3.0 to 5.0% and with a special waveform.

The eighteenth of this invention is functional alloy plating using substitute bonding material for Pb and electronic component to be mounted to which the functional alloy plating is applied, characterized in that a chip tantalum capacitor is wire-bonded to a lead frame and outer leads exposed outside the chip tantalum capacitor are subjected to an electrolytic process with an Ag content to Sn whose content is 92.0 to 90.0% being set to 8.0 to 10.0% and with a special waveform.

The nineteenth of this invention is functional alloy plating using substitute bonding material for Pb and electronic component to be mounted to which the functional alloy plating is applied, characterized in that a chip tantalum capacitor is wire-bonded to a lead frame and outer leads exposed outside the chip tantalum capacitor are subjected to an electrolytic process with a Cu content to Sn whose content is 99.5 to 99.0% being set to 0.5 to 1.0% and with a special waveform.

The twentieth of this invention is functional alloy plating using substitute bonding material for Pb and electronic component to be mounted to which the functional alloy plating is applied, characterized in that general electronic device component materials including a component material which needs plating for bonding and a general component material which needs plating as a functional component are subjected to an electrolytic process with a Bi content to Sn whose content is 99.0% or greater being set to 1.0% or less and with a special waveform.

The twenty-first of this invention is functional alloy plating using substitute bonding material for Pb and electronic component to be mounted to which the functional alloy plating is applied, characterized in that general electronic device component materials including a component material which needs plating for bonding and a general component material which needs plating as a functional component are subjected to an electrolytic process with a Bi content to Sn whose content is 98.0 to 90.0% being set to 2.0 to 10.0% and with a special waveform.

The twenty-second of this invention is functional alloy plating using substitute bonding material for Pb and electronic component to be mounted to which the functional alloy plating is applied, characterized in that general electronic device component materials including a component material which needs plating for bonding and a general component material which needs plating as a functional component are subjected to an electrolytic process with an Ag content to Sn whose content is 99.0 to 97.0% being set to 1.0 to 3.0% and with a special waveform.

The twenty-third of this invention is functional alloy plating using substitute bonding material for Pb and electronic component to be mounted to which the functional alloy plating is applied, characterized in that general electronic device component materials including a component material which needs plating for bonding and a general component material which needs plating as a functional component are subjected to an electrolytic process with an Ag content to Sn whose content is 97.0 to 95.0% being set to 3.0 to 5.0% and with a special waveform.

The twenty-fourth of this invention is functional alloy plating using substitute bonding material for Pb and electronic component to be mounted to which the functional alloy plating is applied, characterized in that general electronic device component materials including a component material which needs plating for bonding and a general component material which needs plating as a functional component are subjected to an electrolytic process with an Ag content to Sn whose content is 92.0 to 90.0% being set to 8.0 to 10.0% and with a special waveform.

The twenty-fifth of this invention is functional alloy plating using substitute bonding material for Pb and electronic component to be mounted to which the functional alloy plating is applied, characterized in that general electronic device component materials including a component material which needs plating for bonding and a general component material which needs plating as a functional component are subjected to an electrolytic process with a Cu content to Sn whose content is 99.5 to 99.0% being set to 0.5 to 1.0% and with a special waveform.

[Embodiment]

[Significance of Special Waveform]

A description will now be given of the aforementioned "electrolytic process with a special waveform". First, typical electroplating is DC plating, i.e., plating with a voltage having an AC voltage rectified by a rectifier.

To perform plating, it is necessary to combine and add several types of organic additives into a plating solution so that the crystal grain size of metal to be deposited does not become resin particle size.

Of course, those organic materials become eutectoid at the same time as the metal to be plated, causing many defects on their functions as bonding materials.

The "electrolytic process with a special waveform" in this invention improves those shortcomings, and an additive to be added into a plating solution is only a slight amount of a surface active agent which is not decomposed and disposed, and this special waveform serves as an organic additive.

In this invention, the special waveform is a pulse waveform which is acquired for an electrolytic process from a current that has been rectified with a thyristor 6-phase half wave. Thus, the electrolytic process uses a pulse waveform which can cycle between positive and negative.

The following shows a table of the types of mass-producible platings.

TABLE 1

| Coats | Composition | Melt-originated offset | Note |
|---|---|---|---|
| Sn—Ag | Ag 10% special waveform plating | ○ | Plating by special waveform method of this invention |
| Sn—Ag | Ag 3% special waveform plating | X | Melt-originated offset present even with plating by special waveform method of this invention |
| Sn—Bi | Bi 3% special waveform plating | ○ | Plating by special waveform method of this invention |
| Sn | Sn 100% | X | Normal gloss plating |
| Sn | Sn 99% special waveform plating | ○ | Plating by special waveform method of this invention |
| Sn—Pb | Pb 10% special waveform plating | ○ | Plating to which existing chip tantlum is applied |

As there are different coat characteristics to be acquired depending on whether the lead types of devices to be used are lead lines, a lead frame or leadless, they should be selectively used, but the added values of the devices differ device by device so that a cost-based selection is also considered as an important factor.

In the comparison of the costs for plating materials, the cost for the base acid is high even if an inexpensive metal is used, so that the cost does not decrease as indicated in the comparison of the prices of metals. A further variation is seen when it is run as plating.

Then, the following table shows the evaluation of Pb-free coats as coats.

TABLE 2

| Types of coats | Contents | Note |
|---|---|---|
| Sn—Ag plating | Ag 3–10% | Melting point of 220–260° C. Melt-originated offset occurred by C, Ag composition. Glossy appearance |
| Sn—bi plating | special waveform plating containing Bi of 2–5% | Melting point of 220–225° C. Fragile due to diffusion of Bi into C, copper base. Glossless appearance |
| Sn plating | Different type of metal of 0.2–1% contained as additive | Melting point of 225–230° C. Good reflow. Semi-gloss appearance |

The following table shows a list of the evaluation of the individual coats.

TABLE 3

| | Sn—Ag | Sn—Bi | Sn |
|---|---|---|---|
| Appearance | Gloss | Glossless | Semi-gloss |
| Plating thickness | 4.03 μm | 4.21 μm | 3.99 μm |
| Composition | Sn 92.46% Ag 7.54% | Sn 97.31% Bi 2.69% | Sn 99.84% Bi 0.16% |
| Heat resistance | Discoloration present | Passed | Passed |
| Solderability after heat resistance | Passed | Passed | Passed |
| Bending after heat resistance | Passed | Passed | Passed |

TABLE 3-continued

|  | Sn—Ag | Sn—Bi | Sn |
|---|---|---|---|
| Peeling after heat resistance | Passed | Passed | Passed |
| Melt-originated offset | Present | None | None |
| Solder wettability before heat resistance | Zero-cross 0.65 sec Wet strength 71.4 mg | Zero-cross 0.85 sec Wet strength 23.0 mg | Zero-cross 0.50 sec Wet strength 31.4 mg |
| Solder wettability after heat resistance | Zero-cross 0.95 sec Wet strength 26.4 mg | Zero-cross 0.87 sec Wet strength 23.0 mg | Zero-cross 0.61 sec Wet strength 34.2 mg |
| Bonding strength | 0.37 Kg before heat resistance 0.05 Kg after heat resistance | 1.56 Kg before heat resistance 0.05 Kg after heat resistance | 1.63 Kg before heat resistance 0.70 Kg after heat resistance |
| Vickers hardness | 16.3 | 23.0 | 11.4 |

The following table shows the costs for the individual coats.

TABLE 4

|  | Sample price (¥/Kg) | Price of prototype (¥/Kg) | Price in massproduction (¥/Kg) |
|---|---|---|---|
| Sn—Ag | 2,352 | 2,114 | 1,685 |
| Sn—Bi | 1,488 | 1,363 | 1,148 |
| Sn special waveform plating | 1,518 | 1,518 | 1,089 |
| Special waveform plating | — | — | — |

While the samples shown above had a nickel (Ni) base to avoid diffusion on copper, Sn—Ag showed such a phenomenon that oxidization on Ni through Ag at the time of heat resistance lowered the bondability. In this respect, it is contemplated that copper (Cu) is suitable as the base for Sn—Ag. Further, heat-resistance-originated discoloration and melt-originated offset also occurred. To cope with this melt-originated offset, it is necessary to obtain Sn—Ag plating containing 85% or more of Ag, which is naturally a factor to increase the cost. Slight segregation is seen on the surface of Sn—Bi. Sn—Ag and Sn-special waveform plating still suffer poor solution efficiencies and the line speeds remain about a half the speed of the current special-waveform plating. Although solution conditions were so set as to provide the optimal appearance in the implementation of the scheme, improvements can be made on the density of the solution, the density of the additive, stirring and so forth. In the case of surface mounting, there may be a question on the behavior of Bi, such as segregation or diffusion. In this respect, Bi in the Sn-special waveform plating has a minute amount and serves to adjust the deposition of the plated coat so that it does not seem to raise a problem on segregation or diffusion.

The following gives the results of the evaluation of samples of Sn—Ag, Sn—Bi and Sn plating to chip tantalum frames.

(1) Plating Specifications
   base plating . . . Ni 0.5 to 1.0 μm
      (same for all)
   finishing plating . . . Sn—Ag 3.0 to 5.0 μm
      Sn—Bi 3.0 to 5.0 μm
      Sn 3.0 to 5.0 μm (2) Test Results "Sn—Ag"
a. Appearance: passed (free of spot, stain and discoloration)
b. Heat resistance: discoloration present (160° C.×6 Hr heat resistance, no expansion, peeling, discoloration and fall-off)
c. Solderability test: passed (after heat resistance, 230° C.×3 sec×once n=1)
d. Bending test: passed (after heat resistance, 180° C., bend-back test, measured at A n=1)
e. Melt-originated: no melt-originated offset (no heat offset resistance 270° C.×30 min×once n=1)
f. Peeling test: passed (sample before and after heat resistance n=1)
g. Melting point: 222° C.
h. Hardness (Vickers hardness): 16.3
i. Solder: zero-cross time before heat resistance wettability average 0.65 (sec) after heat resistance average 0.95 (sec)
   : wet strength before heat resistance average 71.40 (mg) after heat resistance average 26.40 (mg) (n=5)
j. Bonding: before heat resistance average 0.37 (kg) strength: after heat resistance average 0.05 (kg) (n=5)
k. Plating thickness: average 4.03 (μm) (measured with fluorescent X rays n=9)
l. Composition: Sn 92.46%
   : Ag 7.54%

"Sn—Bi"
a. Appearance: passed (free of spot, stain and discoloration)
b. Heat resistance: passed (160° C.×6 Hr heat resistance, no expansion, peeling, discoloration and fall-off)
c. Solderability test: passed (after heat resistance, 230° C.×3 sec×once n=1)
d. Bending test: passed (after heat resistance, 180° C., bend-back test, measured at A n=1)
e. Melt-originated: no melt-originated offset (no heat offset resistance 270° C.×30 min×once n=1)
f. Peeling test: passed (sample before and after heat resistance n=1)
g. Melting point: 228° C.
h. Hardness (Vickers hardness): 23.0
i. Solder: zero-cross time before heat resistance wettability average 0.85 (sec) after heat resistance average 0.87 (sec)
   : wet strength before heat resistance average 23.0 (mg) after heat resistance average 23.0 (mg) (n=5)
j. Bonding: before heat resistance average 1.56 (kg) strength: after heat resistance average 0.56 (kg) (n=5)
k. Plating thickness: average 4.21 (μm) (measured with fluorescent X rays n=9)
l. Composition: Sn 97.31%
   : Bi 2.69% (measured at A)

"Sn"
a. Appearance: passed (free of spot, stain and discoloration)
b. Heat resistance: discoloration present (160° C.×6 Hr heat resistance. no expansion, peeling, discoloration and fall-off)

c. Solderability test: passed (after heat resistance, 230° C.×3 sec×once n=1)

d. Bending test: (after heat resistance, 180° C., bend-back test, measured at A n=1)

e. Melt-originated: no melt-originated offset (no heat offset resistance 270° C.×30 min×once n=1)

f. Peeling test: passed (sample before and after heat resistance n=1)

g. Melting point: 232° C.

h. Hardness (Vickers hardness): 11.40° C.

i. Solder: zero-cross time before heat resistance wettability average 0.50 (sec) after heat resistance average 0.61 (sec)
: wet strength before heat resistance average 31.40 (mg) after heat resistance average 34.20 (mg) (n=5)

j. Bonding: before heat resistance average 1.63 (kg) strength: after heat resistance average 0.70 (kg) (n=5)

k. Plating thickness: average 3.99 (μm) (measured with fluorescent X rays n=9)

l. Composition: Sn 99.84%
: Bi 0.16% (measured at A)

(3) Evaluation Method and Data

① Hardness (Vickers Hardness) Measuring Conditions
Measure portion "A" of non-heat-resisted samples under the following conditions by using a super light load minute hardness meter (model mvk-1).

a. load: 0.5 fg b. load keeping time: 15 sec c. load speed: 0.01 mm/sec Measure the diagonal line of a dent three times and compute the Vickers hardness from the average dent area.

② Zero-Crossing Time, Wet Strength Measuring Conditions

Five portions "A" of samples S of a frame were sampled from one piece shown in FIG. 1 and were measured under the following conditions using a solder checker (SAT-2000).

a. Sn 60%, Pb 40% b. TEMP 230° C., SPEED 25 mm/sec c. DEPTH 2 m, SENS 1 d. Flux present (MI L type R used)

(4) Solder Wettability Data

① The solder wettability data of Sn—Ag is illustrated in Table 5.

TABLE 5

| Sn—Ag | Data | | | | | Average |
| --- | --- | --- | --- | --- | --- | --- |
| Zero-cross before heat resistance | 0.65 | 0.69 | 0.63 | 0.67 | 0.60 | 0.65 |
| (sec) after heat resistance | 1.02 | 0.90 | 0.80 | 1.00 | 1.05 | 0.95 |
| Wet strength before heat resistance | 84.0 | 69.0 | 81.0 | 55.0 | 68.0 | 71.4 |
| (mg) after heat resistance | 32.0 | 23.0 | 27.0 | 20.0 | 30.0 | 26.4 |

② The solder wettability data of Sn—Bi is illustrated in Table 6.

TABLE 6

| Sn—Bi | Data | | | | | Average |
| --- | --- | --- | --- | --- | --- | --- |
| Zero-cross before heat resistance | 1.01 | 0.82 | 0.97 | 0.62 | 0.83 | 0.85 |
| (sec) after heat resistance | 0.76 | 0.85 | 0.99 | 0.89 | 0.88 | 0.87 |
| Wet strength before heat resistance | 16.0 | 24.0 | 19.0 | 35.0 | 21.0 | 23.0 |
| (mg) after heat resistance | 25.0 | 22.0 | 24.0 | 20.0 | 24.0 | 23.0 |

③ The solder wettability data of Sn is illustrated in Table 7.

TABLE 7

| Sn | Data | | | | | Average |
| --- | --- | --- | --- | --- | --- | --- |
| Zero-cross before heat resistance | 0.49 | 0.49 | 0.34 | 0.54 | 0.64 | 0.50 |
| (sec) after heat resistance | 0.73 | 0.49 | 0.61 | 0.59 | 0.63 | 0.61 |
| Wet strength before heat resistance | 27.0 | 34.0 | 44.0 | 28.0 | 24.0 | 31.4 |
| (mg) after heat resistance | 28.0 | 41.0 | 32.0 | 37.0 | 33.0 | 34.2 |

(5) Bonding Strength Measuring Conditions

Cut portion "C" under leads at 3 mm in width, and sample ten from two pieces. Place cut samples one on another with a clearance of 0.3 mm and solder-dip under the following conditions using a solder checker.

a. Sn 60%, Pb 40% b. TEMP 230° C., SPEED 25 mm/sec c. DEPTH 2 mm, SENS 1 d. Flux present (MI L type R used)

Measure the force to peeling by using a push-pull gauge.

TABLE 8

| Sn—Ag | Data | | | | | Average |
| --- | --- | --- | --- | --- | --- | --- |
| Sample before heat resistance | 0.38 | 0.29 | 0.53 | 0.37 | 0.28 | 0.37 |
| Sample after heat resistance | 0.03 | 0.07 | 0.08 | 0.02 | 0.05 | 0.05 |

TABLE 9

| Sn—Bi | Data | | | | | Average |
| --- | --- | --- | --- | --- | --- | --- |
| Sample before heat resistance | 1.30 | 1.54 | 1.23 | 1.52 | 2.21 | 1.56 |
| Sample after heat resistance | 0.53 | 0.35 | 0.74 | 0.54 | 0.65 | 0.56 |

TABLE 10

| Sn—Bi | Data | | | | | Average |
| --- | --- | --- | --- | --- | --- | --- |
| Sample before heat resistance | 1.32 | 1.82 | 1.62 | 1.57 | 1.83 | 1.63 |
| Sample after heat resistance | 0.57 | 0.62 | 0.60 | 1.01 | 0.69 | 0.70 |

(6) Plating Thickness Measuring Portion

Three portions "A", "a" and "b" of a sample S of a frame per piece were measured and as there were five pieces of frames, a total of nine portions, both ends and the center, were measured using fluorescent X rays.

TABLE 11

| Sn—Ag | Left end of frame | Center | Right end | Average (μm) |
|---|---|---|---|---|
| Measuring portion A | 3.99 | 4.04 | 4.10 | |
| a | 3.85 | 3.97 | 4.05 | |
| b | 4.07 | 4.21 | 4.03 | 4.03 |

TABLE 12

| Sn—Bi | Left end of frame | Center | Right end | Average (μm) |
|---|---|---|---|---|
| Measuring portion A | 4.29 | 3.95 | 3.75 | |
| a | 4.08 | 4.31 | 4.27 | |
| b | 4.47 | 4.54 | 4.21 | 4.21 |

TABLE 13

| Sn—Ag | Left end of frame | Center | Right end | Average (μm) |
|---|---|---|---|---|
| Measuring portion A | 4.53 | 3.79 | 3.70 | |
| B | 4.27 | 3.83 | 3.95 | |
| C | 3.99 | 3.94 | 3.89 | 3.99 |

(7) Measuring Portions

As shown in FIG. 1, the measuring portions "A" and "B" of the sample S of the frame may indicate other portions of the same shapes in one piece. That is, it means that they include the measuring portion "A" and portions "a" and "b" or the like.

With regard to the evaluation coats, evaluation method and measuring method, the results of the comparison of the characteristics of the individual Pb-free coats as shown in Tables 14 to 16 were obtained.

TABLE 14

| Evaluation coats | Names | Composition (Remainder: Sn) | Note |
|---|---|---|---|
| | Sn—Ag | Ag 3.0–5.0% | |
| | Sn—Bi | Bi 1.0–3.0% | |
| | Sn-special waveform plating | Bi 0.1–0.5% | Sn coat for surface mount |
| | As-special waveform plating | Pb 5.0–15.0% | Solder coat (As bathed) for surface mount |
| | BF-special waveform plating | Pb 5.0–15.0% | Solder coat (boron fluoride bathed) for surface mount |
| | Glossy solder | Pb 5.0–15.0% | Ordinary glossy solder plated coat (coat for connector or the like) |
| | Glossless solder | Pb 5.0–15.0% | Ordinary glossless solder plated coat (outer solder coat) |

TABLE 15

| Evaluation method | Evaluation items | Contents |
|---|---|---|
| | Appearance | Free of spot, stain and discoloration |
| | Heat resistance | heat resistance at 150° C. × 3 Hr, no expansion, peeling, discoloration and fall-off |
| | Solderability | 230° C. × 3 sec × once after heat resistance. Solder should be 95% or more after soaking |
| | Bending | 180° C. after heat resistance. No plating separation in bend-back test |
| | Melt test | No coat offset when non-heat-resisted product is heated at 270° C. × 30 min and cooled and condensed |
| | Peeling | Cut a sample after heat resistance with a cutter, apply a cellophane tape and remove it, and plating should not be peeled |

TABLE 16

| Evaluation method | Evaluation items | Contents |
|---|---|---|
| | Melting point (° C.) | Measured temperature at end of melting using METTLER FP900 thermo system |
| | Solder wettability | Measured five times under the following conditions using zero-cross time, wet strength measuring conditions, solder checker (SAT-2000) Sn 60S, Pb 40%, TEMP 230° C., PEED 25 mm/sec, DEPTH 2 mm flux present "zero-cross (sec) wet strength (mg)" samples before and after heat resistance n = 5 |
| | Vickers hardness | Measured non-heat-resisted samples under the following conditions by using a super light load minute hardness meter (model mvk-1). load: 0.5 gf, load keeping time: 15 sec, load speed: 0.01 mm. Measured the diagonal line of a dent three times and computed the Vickers hardness from the average dent area |

TABLE 16-continued

| Evaluation method | Evaluation items | Contents |
|---|---|---|
| | Bonding strength (kg) | Sampled ten samples at a width of 3 mm. Place cut samples one on another with a clearance of 0.3 mm and solder-dip them under the following conditions using a solder checker. sn 60%, Pb 40%, EMP 230° C., SPEED 25 mm/sec. DEPTH 2 mm. Flux present. Measured force to separation using a push-pull gauge. Samples before and after heat resistance n = 3 |
| | Plating thickness (μm) Composition (%) Pb-less So | Measured with a fluorescent X-ray film thickness measuring unit Pb-less plating . . . Measured by SEM (Scannig Electron Microscope). N = 3 So plating . . . Measured with a fluorescent X-ray film thickness measuring unit. N = 5 |

EXAMPLES

Examples of this invention will now be described with reference to the accompanying drawings. In the diagrams, "1" is a lead frame where a mount component, such as an IC chip, is mounted, and which has an island portion 2 in the center portion and a plurality of outer leads at the periphery.

"3" denotes outer leads which become to-be-plated portions and protrude outward of the IC package, and "4" is a ball lead portion which becomes a to-be-plated portion as external leads of CSP.

While alloy plating to be applied to the aforementioned to-be-plated portions contains Sn and a plating material other than lead, and the composition is as follows. The set ratios are Bi=1.0% with respect to Sn=99.0% in the first example, and Bi=2.0 to 10.0% with respect to Sn=98.0 to 90.0% in the second example. The ratio is set to Ag=1.0 to 3.0% with respect to Sn=99.0 to 97.0% in the third example. The ratio is set to Ag=3.0 to 5.0% with respect to Sn=97.0 to 95.0% in the fourth example. The ratio is set to Ag=8.0 to 10.0% with respect to Sn=92.0 to 90.0% in the fifth example. The ratio is set to Cu=0.5 to 1.0% with respect to Sn=99.5 to 90.0% in the sixth example.

"5" is an IC chip, a mount component, to be mounted on the lead frame 1, "5'" is an LSI chip, and "5''" is a chip tantalum capacitor. "6" denotes inner leads, and "7" is a package which has the IC chip 5 or the LSI chip 5' molded with a resin. FIG. 8 shows an IC wafer.

In FIG. 6, "8" is an IC wafer in a pretreatment in the IC fabrication process, and a plurality of patterns are formed on the IC wafer of 150 to 200 mm in diameter.

[Specific Examples of Steps]
(1) IC Fabrication Process
 a. IC wafer step=form a plurality of patterns on the IC wafer (FIG. 6) of 150 to 200 mm in diameter. There are actually over 300 steps to this step.
 b. Dicing=dice the IC wafer 8 into individual semiconductor IC chips 5 (FIG. 6). The above are pretreatments.
 c. Die bonding=adhere and fix the IC chip 5 to the island portion 1' of the lead frame 1 (FIG. 7).
 d. Wire bonding=bond the IC chip 5 to electrodes 3' of the lead frame 1 and the inner leads 6 (FIG. 7).
 e. Resin mold=perform resin molding to form and protect the package 7 (FIG. 8). The above are post-treatments.

(2) IC Assembling Step
 a. IC lead frame forming=form the elongated lead frame 1 by press punching and photoetching a rolled thin metal plate (42 alloy, copper alloy) (chain-line portion in FIG. 6).
 b. Inner plating=apply gold plating or silver plating to the IC lead frame (island portion 2 and inner leads 6) before resin molding (FIG. 6).
 c. Die bonding and wire bonding bond the IC chip 5 to the island portion 2 of the lead frame. Then, connect the IC chip 5 to the electrodes 3' of the lead frame 1 by the inner leads 6 (FIG. 7).
 d. Resin molding=Seal and fix the IC chip 5 and the inner leads 6 in the package 7 with plastic, such as epoxy resin or silicon resin (FIG. 8).
 e. Baking=perform a high-temperature treatment for stabilization after resin molding.
 f. Resin variable removal=remove a thin resin coat sticking out over the lead frame 1 at the time of resin molding. Thereafter, perform honing with water jet, resin or glass beads.
 g. Outer plating=Plate the outer leads 3 with a Pb-free material according to this invention containing Sn as an essential component and Bi, Ag or Cu by using an electrolytic process with a special waveform with a melting point in a range of 220 to 250° C. That is, as the aforementioned alloy plating material, Bi is set to or less 1.0% with respect to Sn=99.0% in the first example, Bi is set to 2.0 to 10.0% with respect to Sn=98.0 to 90.0% in the second example, Ag is set to 1.0 to 3.0% with respect to Sn=99.0 to 97.0% in the third example, Ag is set to 3.0 to 5.0% with respect to Sn=97.0 to 95.0% in the fourth example, Ag is set to 8.0 to 10.0% with respect to Sn=92.0 to 90.0% in the fifth example, and Cu is set to 0.5 to 1.0% with respect to Sn=99.5 to 90.0% in the sixth example.
 h. Cutting=cut away the individual IC packages 7 from the linked frames (chain lines K in FIG. 8, chain lines K in FIG. 5).
 i. Bend the outer leads 3 according to the intended mounting (FIG. 2 shows mounting on a printed circuit board).
 j. Mount the IC package 7 on an electrode pattern 10 of a printed circuit board 9 and solder bonding portions to the outer leads 3 (FIGS. 2 and 3). In this case, it is placed on the electrode pattern 10 of the printed circuit board 9 that faces the ball leads 4 of BGA or CSP (FIG. 4).

[Effect of the Invention]

With the above-described structure, this invention eliminates Pb from a solder material as a bonding material which is essential for electronic components in the production of electronic devices, thereby preventing a possible pollution problem such that when electronic devices which become unnecessary are disposed of, Pb leaks and seeps into groundwater.

In mounting electronic components, alloy plating equivalent to or greater than Pb can be acquired without using Pb but by using other bonding materials than Pb.

DESCRIPTION OF REFERENCE NUMERALS

Figure 1:
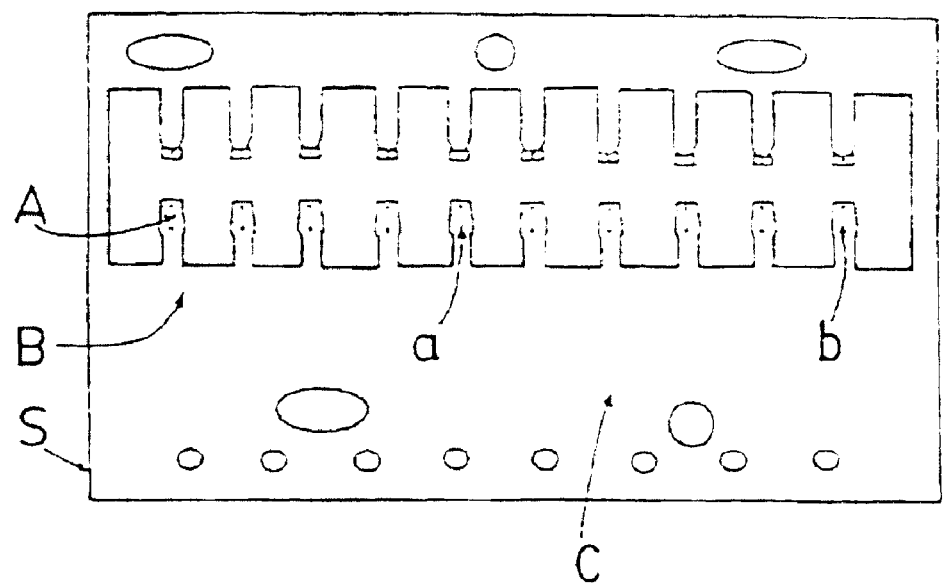
FIG. 1 is a plan view of one piece of a frame 1.
Figure 2:
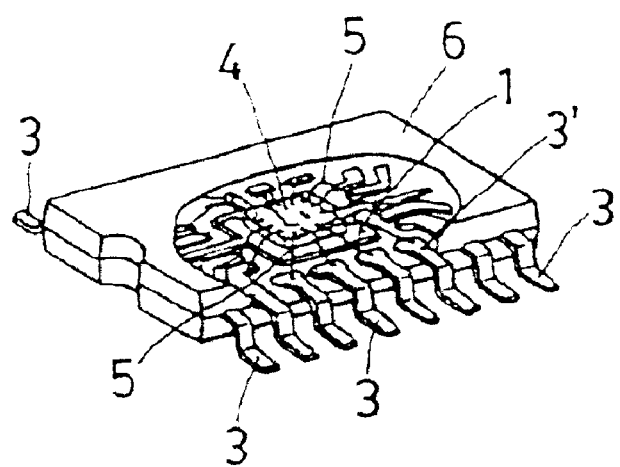
FIG. 2 is a perspective view of an IC package that packages an IC chip to which alloy plating is applied with a substitute bonding material for Pb according to this invention is mounted on a lead frame.
Figure 3:
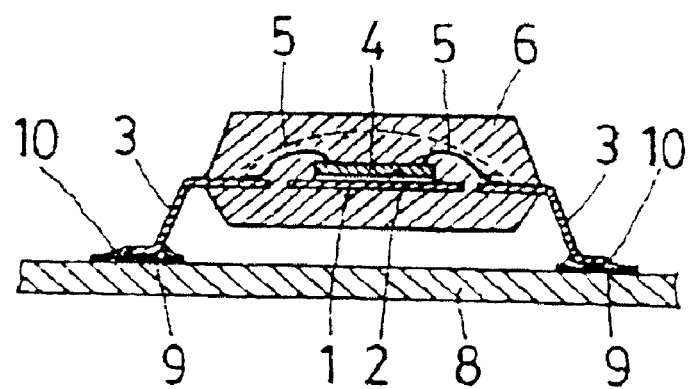
FIG. 3 is a cross-sectional view of an IC package to which alloy plating is applied with a substitute bonding material for Pb according to this invention and which is mounted on a printed circuit board.
Figure 4:
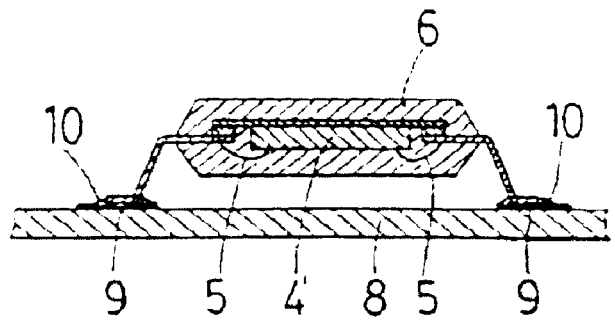
FIG. 4 is a cross-sectional view of an LSI package to which alloy plating is applied with a substitute bonding material for Pb according to this invention and which is mounted on a printed circuit board.
Figure 5:
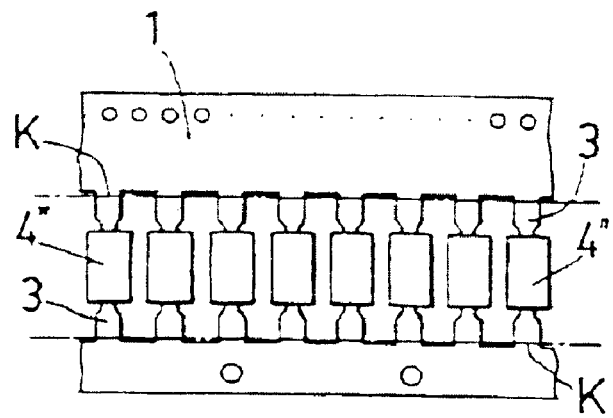
FIG. 5 is a plan view of a chip tantalum capacitor mounted on a lead frame.
Figure 6:
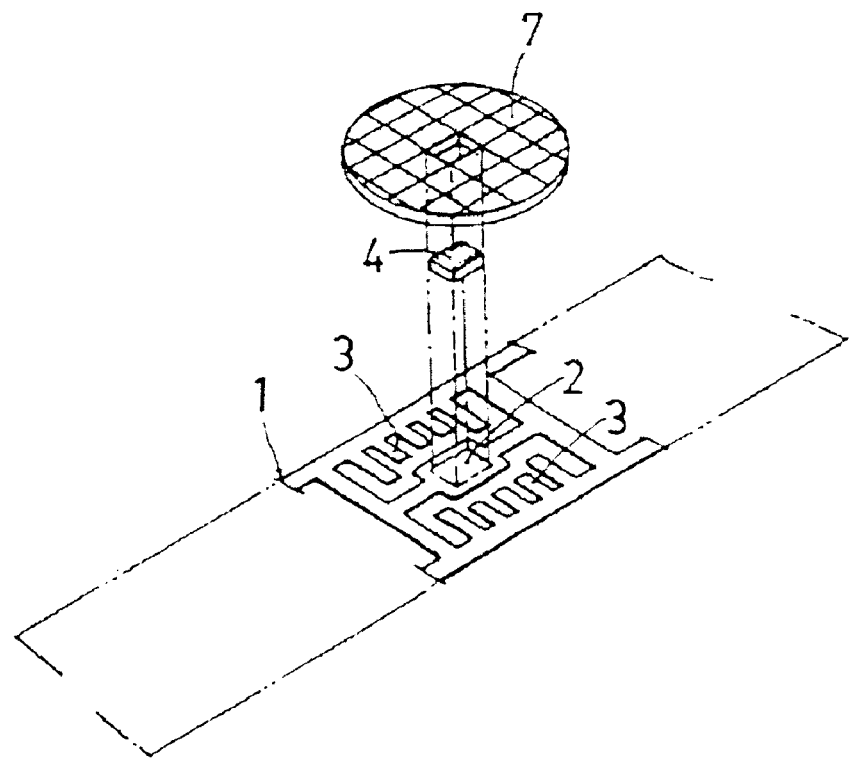
FIG. 6 is a perspective view of dicing and die bonding in the IC fabrication process.
Figure 7:
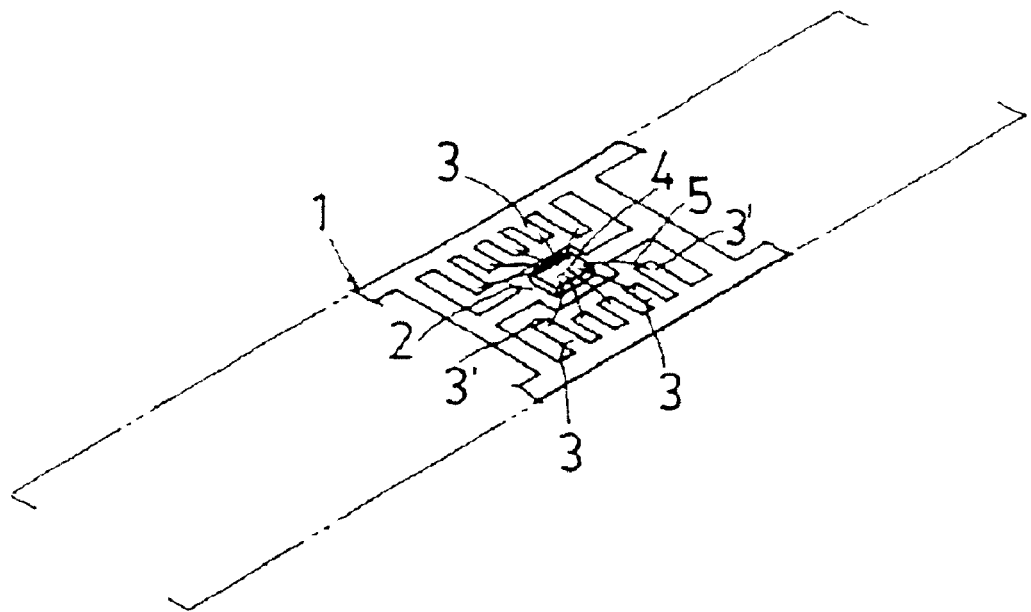
FIG. 7 is a perspective view of wire bonding in the IC fabrication process.
Figure 8:
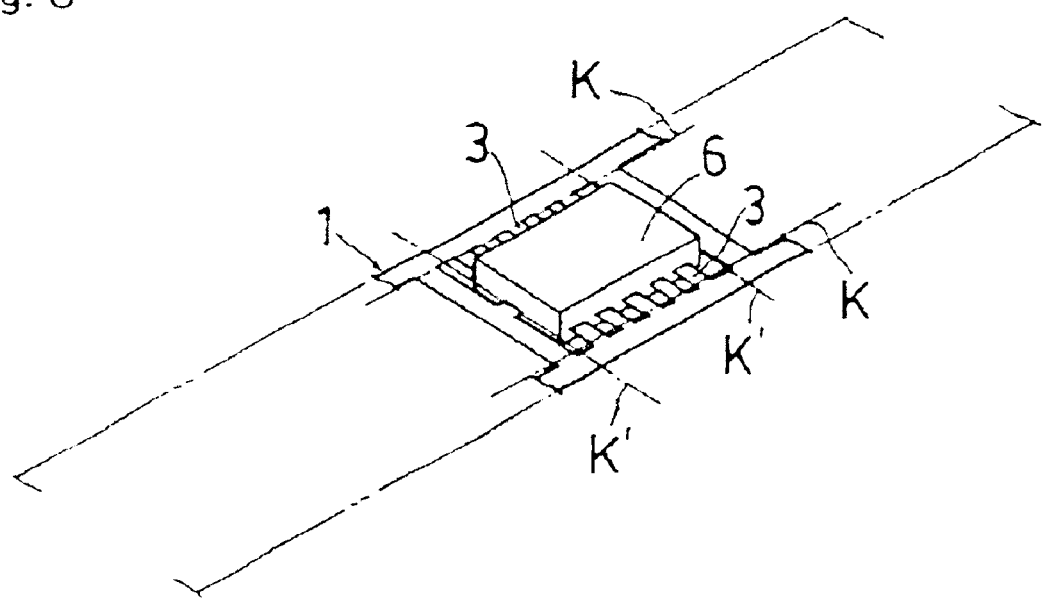
FIG. 8 is a perspective view of packaging a lead frame with resin molding.

A first measuring portion
B second measuring portion
a third measuring portion
b fourth measuring portion
1 lead frame
2 island portion
3 outer leads
4 ball lead portion
5 IC chip
6 inner leads
7 IC package
8 IC wafer
9 printed circuit board
10 electrode pattern
11 soldering bonding portion

What is claimed is:

1. A process for functional alloy plating using substitute bonding material for Pb, comprising applying functional alloy plating to an electronic component to be mounted using an electrolytic process with a pulse waveform, said functional alloy plating comprising Sn as base, and Cu, wherein said Cu content to said Sn is set to 0.5 to 1.0%.

2. The process according to claim 1 wherein the pulse waveform cycles between positive and negative.

3. The process according to claim 2 wherein the pulse waveform cycling between positive and negative comprises a 6-phase half-wave.

4. The process according to claim 3 wherein the 6-phase half wave comprises a thyristor 6-phase half wave.

5. A process for functional alloy plating using substitute bonding material for Pb, said process comprising wire-bonding an IC chip to a lead frame, and subjecting outer leads exposed outside a molded IC package to an electrolytic process with an Sn content which is 99.5 to 99.0%, and a Cu content to said Sn being set to 0.5 to 1.0% and with a pulse waveform.

6. The process according to claim 5 wherein the pulse waveform cycles between positive and negative.

7. The process according to claim 6 wherein the pulse waveform cycling between positive and negative comprises a 6-phase half-wave.

8. The process according to claim 7 wherein the 6-phase half wave comprises a thyristor 6-phase half wave.

9. A process for functional alloy plating using substitute bonding material for Pb comprising subjecting an electrode pattern of a printed circuit board to an electrolytic process with an Sn content which is 99.5 to 99.0%, and a Cu content to said Sn being set to 0.5 to 1.0% and with a pulse waveform.

10. The process according to claim 9 wherein the pulse waveform cycles between positive and negative.

11. The process according to claim 10 wherein the pulse waveform cycling between positive and negative comprises a 6-phase half-wave.

12. The process according to claim 11 wherein the 6-phase half wave comprises a thyristor 6-phase half wave.

13. A process for functional alloy plating using substitute bonding material for Pb comprising wire-bonding a chip tantalum capacitor to a lead frame, and subjecting outer leads exposed outside said chip tantalum capacitor to an electrolytic process with an Sn content which is 99.5 to 99.0%, and a Cu content to said Sn being set to 0.5 to 1.0% and with a pulse waveform.

14. The process according to claim 13 wherein the pulse waveform cycles between positive and negative.

15. The process according to claim 14 wherein the pulse waveform cycling between positive and negative comprises a 6-phase half-wave.

16. The process according to claim 15 wherein the 6-phase half wave comprises a thyristor 6-phase half wave.

17. A process for functional alloy plating using substitute bonding material for Pb comprising subjecting general electronic device component materials including a component material which needs plating for bonding and a general component material which needs plating as a functional component to an electrolytic process with an Sn content which is 99.5 to 99.0%, and a Cu content to said Sn being set to 0.5 to 1.0% and with a pulse waveform.

18. The process according to claim 17 wherein the pulse waveform cycles between positive and negative.

19. The process according to claim 18 wherein the pulse waveform cycling between positive and negative comprises a 6-phase half-wave.

20. The process according to claim 19 wherein the 6-phase half wave comprises a thyristor 6-phase half wave.

* * * * *